United States Patent
Tsutsumi et al.

(10) Patent No.: US 7,583,356 B2
(45) Date of Patent: Sep. 1, 2009

(54) EXPOSURE APPARATUS AND DEVICE MANUFACTURING METHOD

(75) Inventors: Ryosuke Tsutsumi, Utsunomiya (JP); Norihiko Kobayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/121,638

(22) Filed: May 15, 2008

(65) Prior Publication Data
US 2008/0291414 A1 Nov. 27, 2008

(30) Foreign Application Priority Data
May 16, 2007 (JP) ............................. 2007-131079

(51) Int. Cl.
*G03B 27/68* (2006.01)
*G03B 27/42* (2006.01)
(52) U.S. Cl. .......................................... 355/52; 355/53
(58) Field of Classification Search ................... 355/52, 355/53, 55, 67, 77; 250/548, 492.2; 356/399–401
See application file for complete search history.

(56) References Cited

U.S. PATENT DOCUMENTS

| 6,277,533 | B1 * | 8/2001 | Wakamoto et al. | ............ 430/30 |
| 6,559,465 | B1 * | 5/2003 | Yamada et al. | ......... 250/559.29 |
| 6,657,703 | B2 | 12/2003 | Kurosawa | |
| 6,940,584 | B2 | 9/2005 | Kurosawa | |
| 7,027,128 | B2 | 4/2006 | Kurosawa | |
| 7,292,311 | B2 * | 11/2007 | Kurosawa | .................... 355/53 |

FOREIGN PATENT DOCUMENTS

JP    2001-332471 A    11/2001

* cited by examiner

*Primary Examiner*—Hung Henry Nguyen
(74) *Attorney, Agent, or Firm*—Canon USA Inc IP Division (57) ABSTRACT

An exposure apparatus includes a stage configured to hold a substrate; a projection optical system configured to project light from an original onto the substrate; a measurement device configured to measure a position of a surface of the substrate in an optical axis direction of the projection optical system; and a controller configured to i) cause the measurement device to measure positions of the surface with respect to a plurality of points on the surface over a plurality of shot areas, ii) obtain a shape of the surface based on the positions of the surface measured with respect to the plurality of points, and iii) cause the stage to be moved based on the obtained shape between an exposure of a first shot area and an exposure of a second shot area, and the measurement device to measure a position of a surface in the second shot area.

12 Claims, 11 Drawing Sheets

EXPOSURE APPARATUS AND DEVICE MANUFACTURING METHOD

BACKGROUND OF THE INVENTION

1. Field of the Invention

The present invention relates to an exposure apparatus configured to expose a substrate to light and a device manufacturing method using the exposure apparatus.

2. Description of the Related Art

A reduction projection exposure apparatus is mainly used in manufacturing an electronic device such as a semiconductor device. The reduction projection exposure apparatus transfers a circuit pattern of a reticle (a photomask with the circuit pattern) onto an exposure target wafer (substrate) to which a photoresist (a photosensitive material) is applied, while reducing the circuit pattern. Currently, a scanning exposure apparatus (scanner) is in the mainstream of the exposure apparatus.

The scanning exposure apparatus is an improvement of a stationary exposure apparatus (stepper). In the stepper, a reticle pattern is exposed with a single shot exposure. Since the stepper uses a single shot exposure, local focus and tilt correction in a shot area has been difficult.

On the other hand, the scanning exposure apparatus transfers a circuit pattern of a whole reticle onto a wafer by scanning the reticle using a light which passes through a slit. The scanning exposure apparatus is capable of following a change in a local surface shape in a shot area since the scanning exposure uses light that passes through the slit and a distortion in a scanning direction of a projection optical system can be averaged. In a focus/leveling drive of a wafer stage during the scanning exposure, a pre-reading sensor and a sensor detecting a wafer shape in a slit area of a shot to be exposed are used to determine a focus/tilt amount. The sensors are included in a scanning focus measuring apparatus.

With these sensors, the wafer stage is controlled to preliminarily follow a target position on a best focus image plane obtained from the scanning measurement result before a photoresist is exposed. The above is performed before a step of an exposure target shot passes through an area irradiated with an exposure light which is limited by an exposure slit.

However, according to a scanning exposure method using the pre-reading sensor, a position of the pre-reading sensor of a scan focus measuring apparatus is determined in advance by a hardware design of the apparatus. As a result, if a scanning exposure speed is too fast or if a deformation of the wafer shape exceeds a certain amount due to a process factor or the like pre-reading driving may not be finished in time and may cause a negative effect on focus accuracy or synchronization accuracy. Japanese Patent Application Laid-Open No. 2001-332471 discusses an exposure apparatus which is capable of minimizing an effect of a defective shot on shots in the vicinity thereof and of reducing a number of defective shots. The exposure apparatus is capable of reducing inappropriate operations made by an operator and is capable of detecting a wafer chuck contamination in the exposure process.

In recent years, a layout and an invalid area are reexamined for improvement of yield per wafer, which contributes to improvement of total productivity. In order to improve the total productivity, it is useful to transfer more mask patterns onto a single wafer. Accordingly, a shot is arranged not only to fit all angles of view into a wafer but also to use an outer periphery on the wafer edge. A number of processed wafers per unit time tends to increase year by year. This is achieved by setting as fast a scanning speed as is feasible.

However, with respect to a processed wafer which repeatedly goes through the processes of photoresist application, exposure, and development, it has been difficult to assure highly-accurate focus/leveling drive of a shot near the edge since the wafer shape on the outer periphery is not always favorable. The wafer shape is known to be deformed by heat treatments performed during processing other than the exposure process, for example, a restoration treatment for crystal destruction caused by ion implantation and metal processing of a surface layer of the wafer and metal processing after wiring. Further, the wafer is known to be deformed by heat treatments performed during processing, such as, removal of solvent which hinders pattern formation after a photoresist layer is applied on the surface of the wafer.

Most of the deformed wafers have their outer periphery significantly warped upward or downward. Where an amount of warp exceeds a certain level, shots at the outer periphery may be tilted several hundreds of μrad and deformed in a few μm order. Further, the peripheral area of processed wafers can be locally deformed. At local points of the peripheral area, the surface often has sharp projections and depressions, and the reduction in flatness is unfavorable.

As to such wafers, focus accuracy of the peripheral area is a matter of concern. Focus accuracy problems occur when, for example, a shot is located partially beyond a valid area and thus cannot be measured by a focus detection system or when an unfavorable reduction in flatness at the peripheral area causes incorrect focus/tilt measurement value. When these problems occur, a focus of the exposure portion within a shot is adjusted not to a point where it should be focused (the best focus image plane) but to a distant point. Therefore, defocusing which causes defective exposure shot occurs in the peripheral area of the wafer.

Furthermore, in a peripheral area of a wafer, a great difference in focus/tilt planes may be seen between adjacent shots. A large amount of focus/leveling drive becomes necessary for such shots. In such cases, a wafer stage may be unable to follow a position of the best focus image plane measured by the pre-reading sensor of the focus detector from a position where scanning of the shot is started, and as a result, exposure of the shot may be started even if the shot area is defocused. A similar incorrect drive occurs if a focus invalid area which is a measurement inhibition area is not properly set or if an abnormal value is generated by dust on the wafer.

SUMMARY OF THE INVENTION

The present invention is directed to an exposure apparatus which is capable of improving focus accuracy.

According to an aspect of the present invention, an exposure apparatus configured to expose a substrate includes a stage configured to hold the substrate and to be moved, a projection optical system configured to project light from an original plate onto the substrate held by the stage, a measurement device configured to measure a position of a surface of the substrate in a direction of an optical axis of the projection optical system, and a controller configured to concurrently control a scan of the stage in a scanning direction perpendicular to the direction of the optical axis, a measurement of the position of the surface in a shot area on the substrate by the measurement device, a movement of the stage according to the measured position of the surface, and an exposure of the shot area, wherein the controller is further configured to i) cause the measurement device to measure positions of the surface with respect to a plurality of points on the surface over a plurality of shot areas on the substrate, ii) obtain a shape of the surface based on the positions of the surface measured with respect to the plurality of points, and iii) cause the stage to be moved based on the obtained shape between an exposure of a first shot area on the substrate and an exposure of a second shot area on the substrate, and the measurement device to measure a position of a surface in the second shot area. For example, the plurality of points can be disposed at a plurality of shot areas of the surface.

According to another aspect of the present invention, a device manufacturing method includes exposing a substrate to light using the above-described exposure apparatus, developing the exposed substrate, and processing the developed substrate to manufacture the device.

Further features and aspects of the present invention will become apparent from the following detailed description of exemplary embodiments with reference to the attached drawings.

DETAILED DESCRIPTION OF THE EMBODIMENTS

Various exemplary embodiments, features, and aspects of the invention are described in detail below with reference to the drawings.

First Exemplary Embodiment

Figure 1:
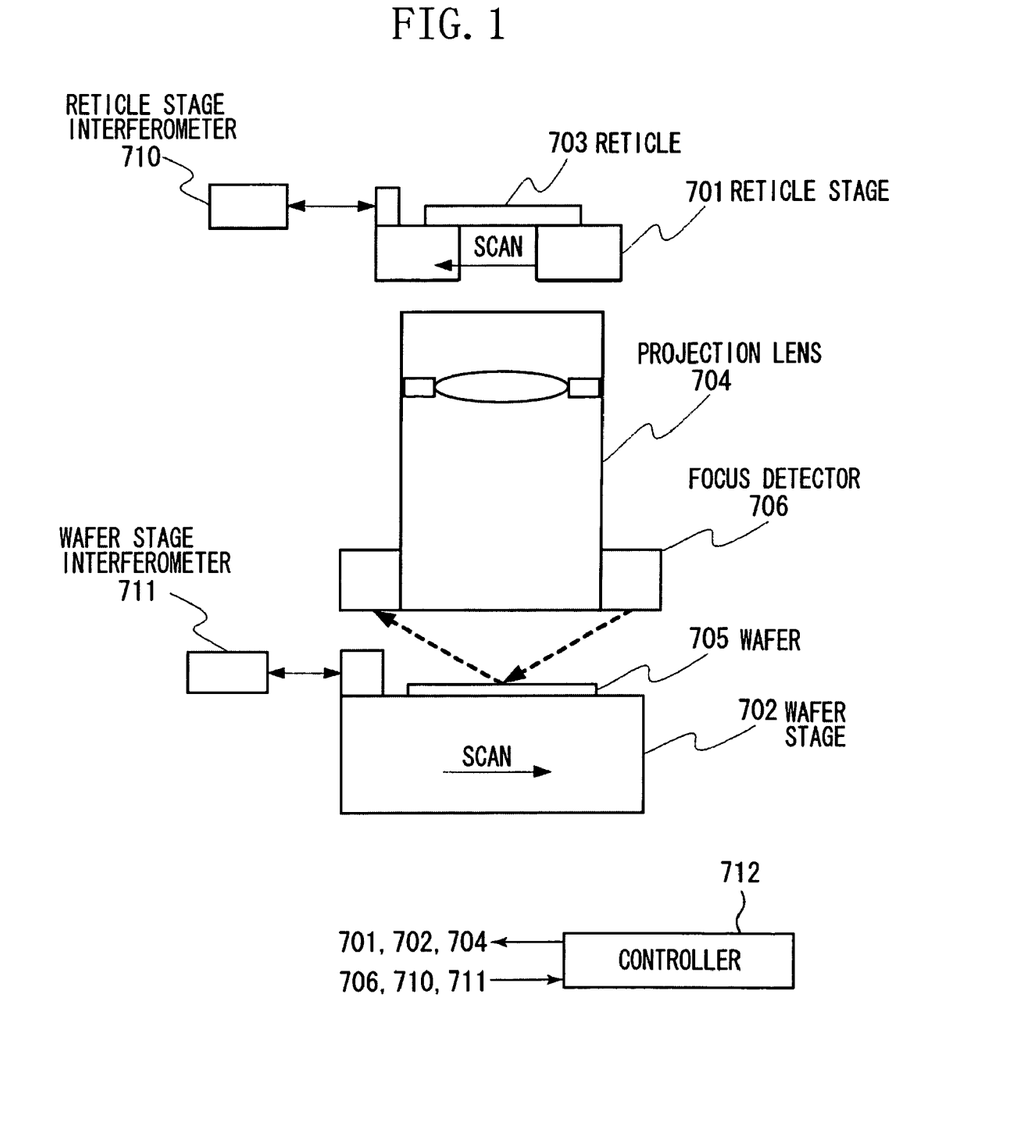
FIG. 1 illustrates an example of a configuration of a scanning exposure apparatus using a wafer stage drive correction method according to a first exemplary embodiment of the present invention.

FIG. 1 illustrates an example of a configuration of a scanning exposure apparatus using a wafer stage drive correction method according to a first exemplary embodiment of the present invention. The scanning exposure apparatus includes a reticle stage 701 configured to mount a reticle 703 which is a mask or an original plate, a projection lens 704 which is a projection optical system, a wafer stage 702 configured to mount a wafer 705 which is a substrate, a focus detector 706, a reticle stage interferometer 710 used for measuring a position of the reticle stage 701, a wafer stage interferometer 711 used for measuring a position of the wafer stage 702, and a controller 712.

The wafer stage 702 holds and moves the wafer 705. The projection lens 704 projects light through the reticle 703 onto the wafer 705 held by the wafer stage 702. The focus detector 706 measures a position of a surface of the wafer 705 in a direction of an optical axis of the projection lens 704.

The controller 712 controls movements of the reticle stage 701, the projection lens 704, and the wafer stage 702 and receives outputs from the focus detector 706, the reticle stage interferometer 710, and the wafer stage interferometer 711. Further, the controller 712 controls exposure of a shot area of the wafer 705 while controlling scanning of the wafer stage 702 in a scanning direction perpendicular to the optical axis, controlling measurement of the position of the surface of the wafer 705 by the focus detector 706, and controlling a drive of the wafer stage 702 according to the position measured by the focus detector 706.

The controller 712 also controls the focus detector 706 to detect a plurality of points on the surface of the wafer prior to the exposure of the shot area to measure the position of the surface. Based on the positions of the plurality of points that are measured, the controller 712 obtains the shape of the surface. Further, the controller 712 controls a position of the wafer stage 702 based on the obtained shape of the surface and the position of the surface in the shot area measured by the focus detector 706 for the exposure of the shot area.

In addition, the controller 712 controls the position of the wafer stage 702 when the focus detector 706 starts measuring the shot area for the exposure of the shot area according to the obtained shape. The controller 712 obtains the shape of the surface by an approximation function of a distance from the center of the wafer 705. Further, the controller 712 obtains the shape of the surface with respect to a portion of the surface. Furthermore, the controller 712 obtains the shape of the surface for each divided area on the surface. Furthermore, the controller 712 sets the plurality of points on the surface by specifying the shot area on the wafer 705.

The controller 712 also corrects the obtained shape of the surface based on the position of the surface which is measured in relation with the shot area by the focus detector 706 for the exposure of the shot area. Further, the controller 712 updates the obtained shape of the surface based on the position of the surface which is measured in relation with the shot area by the focus detector 706 for the exposure of the shot area.

Additionally, the controller 712 obtains the shape of the surface of a part of the wafers 705 within a lot of the wafer 705. Further, the controller 712 updates the obtained shape of the surface by averaging shapes of a plurality of the wafers 705. Furthermore, the controller 712 sets a scanning speed based on the obtained shape of the surface.

As illustrated in FIG. 1, exposure light is output from a light source unit, for example, an excimer laser while the reticle stage 701 and the wafer stage 702 are scanned in opposite directions in the scanning exposure apparatus. The wafer 705 is exposed with the exposure light emitted from the light source unit through the reticle 703 and the projection lens 704. The focus detector 706 receives a reflection of non-exposure light which is emitted obliquely onto the wafer 705 as a measurement target from a light emitting element such as a laser diode. At this time, if a position of a reflected light spot on a light-receiving side changes according to a position of the wafer 705 in a focus direction, a focus value of the area on the plane of the wafer 705 where the measurement light is projected is obtained by measuring a barycentric position of the light-receiving spot.

The focus detector 706 includes a pre-reading sensor and an exposure slit sensor. Since both sensors include a plurality of channels, focus and tilt can be measured at the same time in a single measurement. Further, according to a function which is performed when the measurement is reset, a best focus image plane of the projection lens 704 is calibrated to be in parallel with a focus reference plane which is formed by each channel of the focus detector 706. If a measurement result of the focus detector 706 is zero, the measured point is in the best focus. Further, the scanning is performed so that the wafer stage 702 mainly follows a position measured by the pre-reading sensor during the exposure. In this way, the shape of the wafer 705 can be measured by the focus detector 706.

Figure 2:
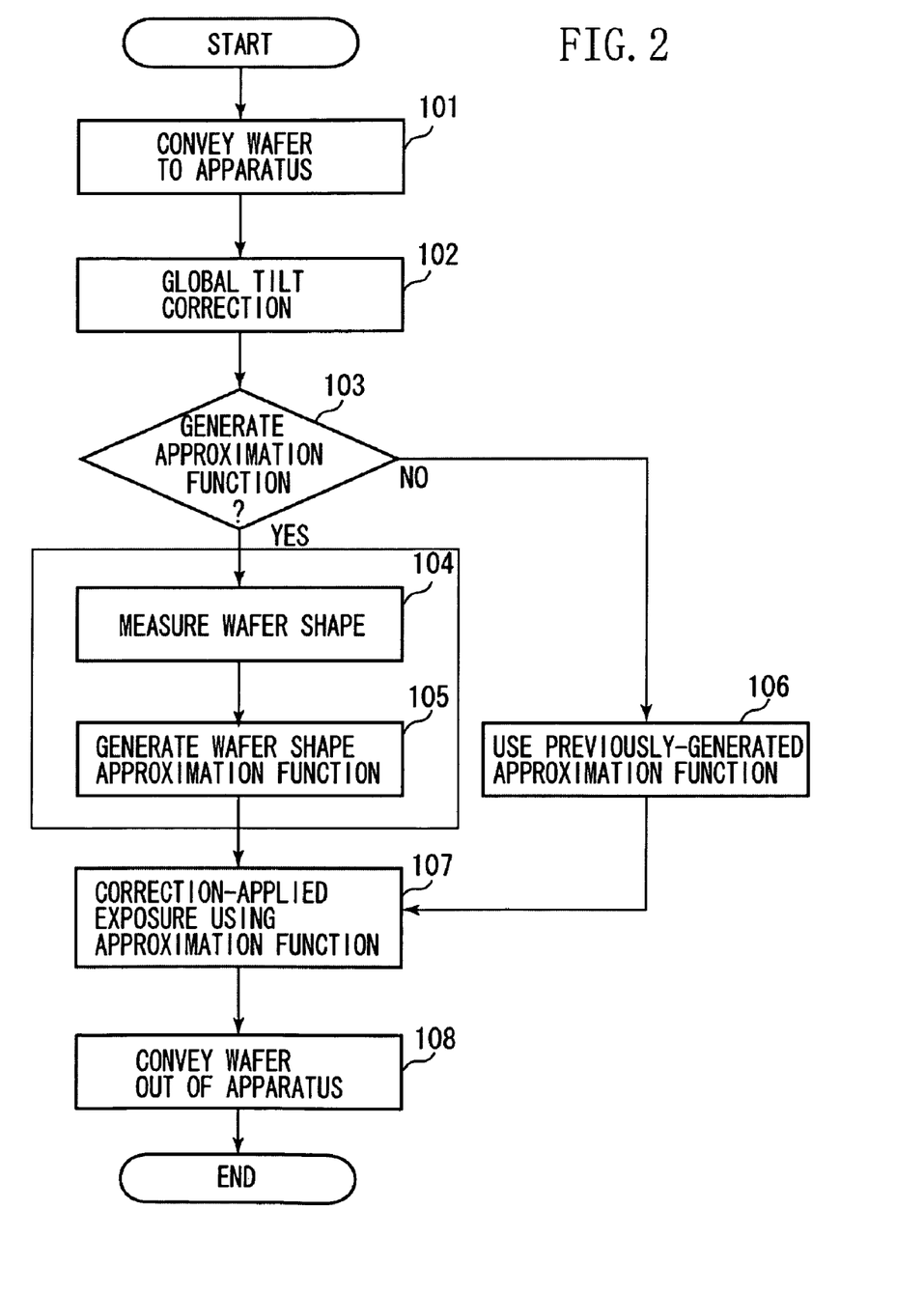
FIG. 2 is a flowchart illustrating an example of the wafer stage drive correction method according to the first exemplary embodiment of the present invention.

FIG. 2 is a flowchart illustrating an example of the wafer stage drive correction method according to the first exemplary embodiment of the present invention.

The method illustrated in FIG. 2 includes a process for generating an approximation function for approximating the wafer shape (steps 104 and 105) and a sub-process for correcting a focus/leveling drive during the exposure operation using the approximation function (step 107).

When a job is started, in step 101, the wafer 705 which is set at a predetermined position in advance is conveyed into the apparatus. Next, in step 102, the controller 712 performs the global tilt correction so that the whole surface of the wafer 705 is in parallel with the best focus image plane which is the reference plane of the focus detector 706. The global tilt correction is a process to correct a global tilt which is affected by an uneven thickness of the wafer 705 itself, a shape of a chuck on which the wafer 705 is mounted, and a wafer setting error which occurs when the wafer 705 is conveyed onto the wafer stage 702. The global tilt is a tilt of the whole surface of the wafer 705 relative to the best focus image plane. The obtained result is regarded as a reference tilt during the exposure processing.

Since the global tilt correction is based on a calculation of a plane, the wafer stage 702 is driven in steps to the same position such as a center of each of three shots or more on the wafer. Next, a height of each point is measured using a same channel of the focus detector 706. From the obtained measurement data, a first-order approximation virtual plane is calculated, for example, by using least square approximation.

In step 103, the controller 712 determines whether to generate the approximation function. If the controller 712 determines to generate the approximation function (YES in step 103), the process proceeds to step 104. If the controller 712 does not determine to generate the approximation function (NO in step 103), then the process proceeds to step 106. In step 106, the controller 712 uses a previously-generated approximation function, and then processing proceeds to step 107. In step 104, the controller 712 measures a detailed wafer shape using the focus detector 706. The controller 712 drives the wafer stage 702 in steps in a specified pitch of, for example, a few millimeters in a sample shot area which is set automatically or manually. Then the controller 712 performs sampling of the wafer shape by measuring a focus of a plurality of points on the surface of the wafer 705.

Figure 3:
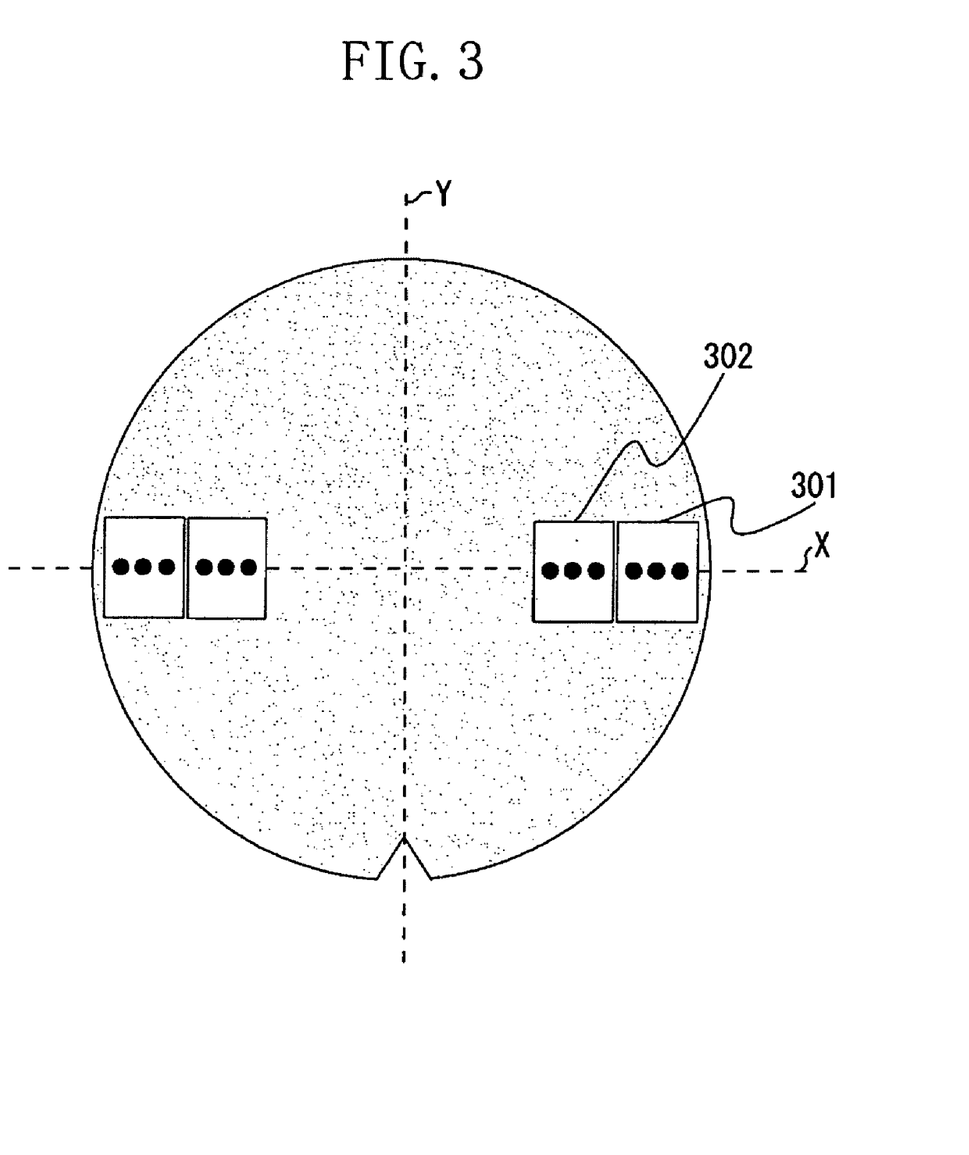
FIG. 3 illustrates an example of sample shots and measurement points used for measuring a shape of the periphery of the wafer according to the first exemplary embodiment of the present invention.

If the scanning drive is not limited, for example, in the drive direction, sampling can be performed using scan focus measurement data. Even if the scanning drive is limited, sampling data can be collected by scanning a path which is the same as the scanning path at the time of exposure. Referring now also to FIG. 3, the sampling data, for example, can be intensively collected from the area nearer the outer periphery of the wafer as illustrated in FIG. 3. The outer periphery of the wafer is where improvement of focus accuracy is typically most important. The sample shot is determined automatically based on a specified rule. The rule may be, for example, "a number M of shots located in the vicinity of an X axis which passes through the center of the wafer but located nearer to the wafer edge (as are shots 301 and 302 illustrated in FIG. 3) and the same number of shots in the opposite side." If the scanning exposure apparatus is equipped with an interface which allows manual setting of the sample shot, a user can set the sample shot individually or input the number of shots, and the interface automatically sets the sample shot. (In FIG. 3, the X axis and a Y axis are illustrated, and a Z axis (not illustrated) points upward out of the page).

If the measurement data collected from the sample shot which is initially set automatically or manually is insufficient, sample shots can be automatically added. For example, if the shot 301 which is on the outermost of the wafer is selected as an initial sample shot, and if the deformation of the wafer 705 exceeds a certain level, sufficient measurement data for generating an accurate approximation function may not be collected. Thus, if a measured value of a point nearer an inner area of the wafer of a sample shot exceeds a specified threshold value, the adjacent shot 302 which is located on the inner side of the shot 301, is also measured.

Further, in a case of a processed wafer, since a circuit pattern of the reticle is already formed on the wafer, a focus measurement of shots near the center of the wafer is performed as well as the shots at the outer periphery in order to extract the shape of the surface of the wafer with high accuracy. In this way, the circuit pattern is calculated and extracted and data of the circuit pattern is removed from the measurement result of the outer peripheral area. Thus, from a measurement value of a focus of a shot in an inner area of the wafer whose position matches each measurement point of the shot area at the outer peripheral area of the wafer, the component of the reticle circuit pattern formed on the wafer is calculated and extracted. In a case where the circuit pattern component does not need to be considered or where the wafer is a bare silicon wafer, the measurement can be performed without considering shot configuration.

Figure 4:
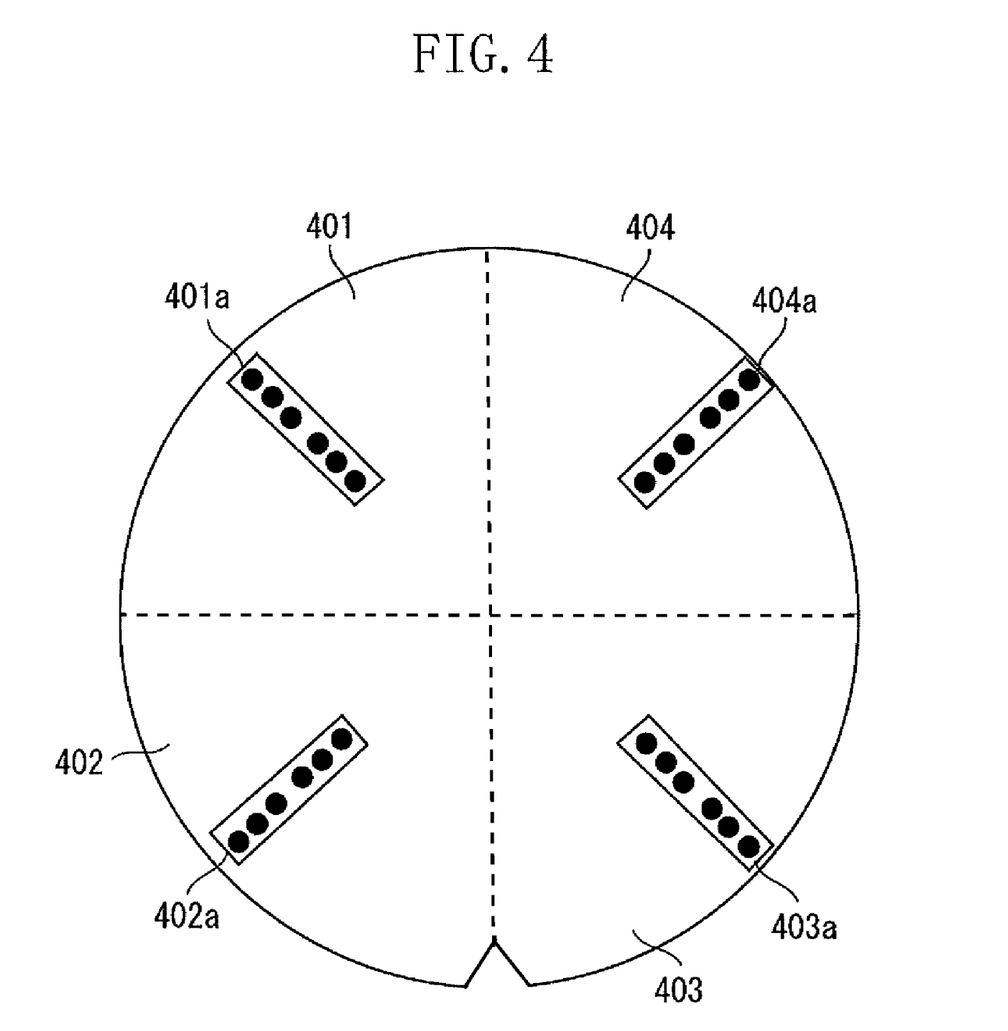
FIG. 4 illustrates an example of the wafer divided into a plurality of zones and a measurement point of each zone according to the first exemplary embodiment of the present invention.

Referring now also to FIG. 4, the wafer can be divided into four zones as illustrated in FIG. 4 for sampling of zones 401, 402, 403, and 404. In this case, sample shot areas 401a, 402a, 403a, and 404a which respectively represents the zones 401, 402, 403, and 404 are selected for each zone. If the shape of the wafer is apparently different by zone, a different type of approximation function or an approximation function having a different coefficient for each zone can be defined. If there is no difference between shapes, equalization can be performed to enhance accuracy of the function.

In dividing the wafer into zones, an image interface used for specifying the zones can be provided or the wafer can be divided automatically. If a zone is set through the image interface, a sample shot which represents the zone can be selected for each zone. If the wafer is automatically divided into zones, variation of a warp at the outer peripheral area of the wafer can be measured.

Before the sampling measurement of the wafer shape is performed, a plurality of points a few millimeters from the wafer edge toward the center of the wafer and at a same radial distance from the center of the wafer are discretely selected. Then a focus measurement of the points is performed. If the shape of the wafer is detected to be different depending on an area, for example, the shapes of the wafer are different between a right side and a left side, then sampling data for such areas can be collected by the shape. If an approximation function is generated for each zone as mentioned above, the approximation function which is used for each shot at the time of the scanning exposure can be automatically selected by managing the zone information together with wafer coordinates.

Once step 104 is completed processing proceeds to step 105. In step 105, the controller 712 generates an approximation function which expresses the wafer surface shape most effectively. The approximation function is expressed by an n-th order polynomial, for example, an n-th order function which expresses the focus value as a function having radius coordinates from the center of the wafer as a variable.

Figure 5:
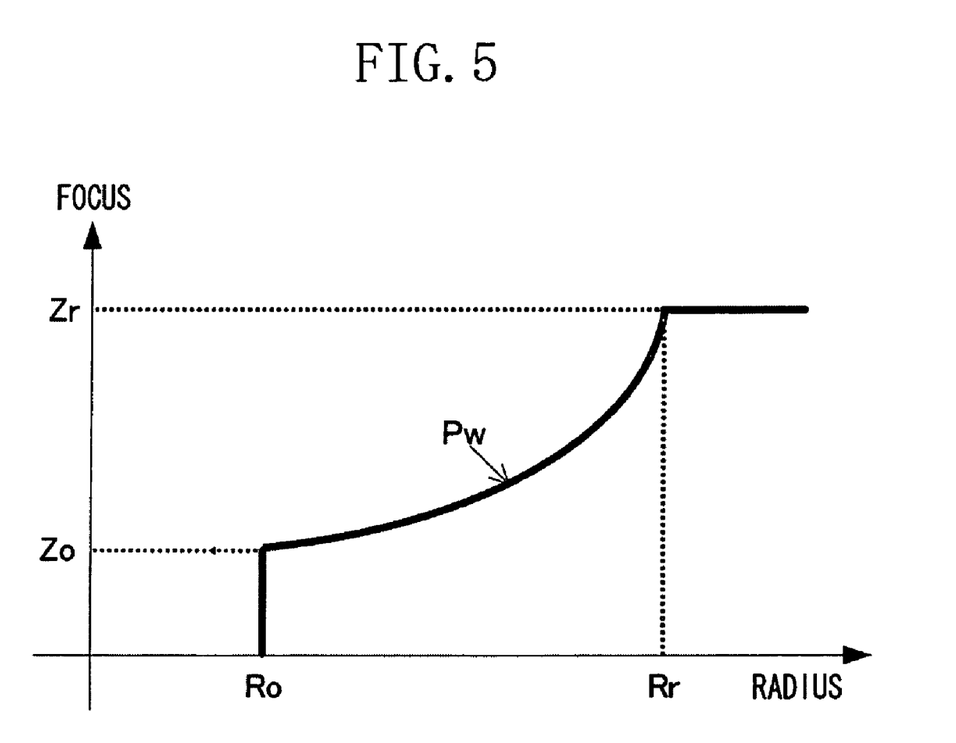
FIG. 5 is a graph illustrating an example of an approximation function of a wafer shape according to the first exemplary embodiment of the present invention.

In a case where the shape of the wafer does not change uniformly, if the order is increased, then the area in the vicinity of the focus-measured point will not match the approximation function. Thus, a function up to a sixth-order is desirably used for the approximation. For that purpose, an interface used for limiting the order can be used. Further, by adopting only the highest coefficient and setting others to zero so that the wafer shape is approximated using only a term of the highest order and an intercept, a function which increases or decreases monotonically is generated as illustrated in FIG. 5. The function can be expressed, for example, by the following expression.

$$f(r) = k*(r-Ro)^{\wedge}Pw + Zo$$

where Pw is an order and $k = (Zr-Zo)/(Rr-Ro)^{\wedge}Pw$.

Referring now also to FIG. 5, an area between Ro and Rr is expressed as a function of a high order curvature. An inside area of Ro is defined as $f(r)=0$ and an outer area of Rr is defined as $f(r)=Zr$. In such a function expression which increases monotonically, a short-period component of the wafer shape can be ignored. Thus, a function which is valid for the whole outer peripheral area of the wafer and independent of a local deformation can be generated. The function is also valid for a wafer which has a warped outer peripheral area.

If the approximation function is not necessary, the wafer shape measurement in step 104 and generation of the wafer shape approximation function in step 105 do not need to be performed. If the approximation function is not generated, the approximation function can be set manually using an interface. Further, as another example, only a shape of a top wafer is measured and its approximation function is generated. Then, the approximation function is applied to subsequent wafers in the exposure processing of a plurality of wafers in a same job. Furthermore, an approximation function of a job previously performed can also be applied to different jobs.

Once step 105 or 106 is completed, processing proceeds to step 107. In step 107, the controller 712 executes the scanning exposure of each shot which is arranged on the wafer. As mentioned above, the focus detector 706 includes the pre-reading sensor used for obtaining the driving target position in advance and the exposure slit sensor used for obtaining the focus information of the exposure slit area onto which the exposure light is emitted. During the exposure, the wafer stage 702 is controlled to follow the focus/tilt target value obtained from the pre-reading sensor information. Then, real time scanning exposure is performed while fine adjustments are made to the position of the wafer stage 702 by the exposure slit sensor.

According to the focus/leveling drive at the time of exposure of the present exemplary embodiment, the exposure drive is corrected using the wafer surface shape approximation function obtained in advance. Further, in order to feedback an exposure accuracy, approximation function information, correction amount information using the approximation function, and remaining drive information at the time of scanning exposure are logged. Once the exposure of all shots is completed, processing proceeds to step 108 wherein the controller 712 carries the exposure-finished wafer out of the scanning exposure apparatus.

Figure 6:
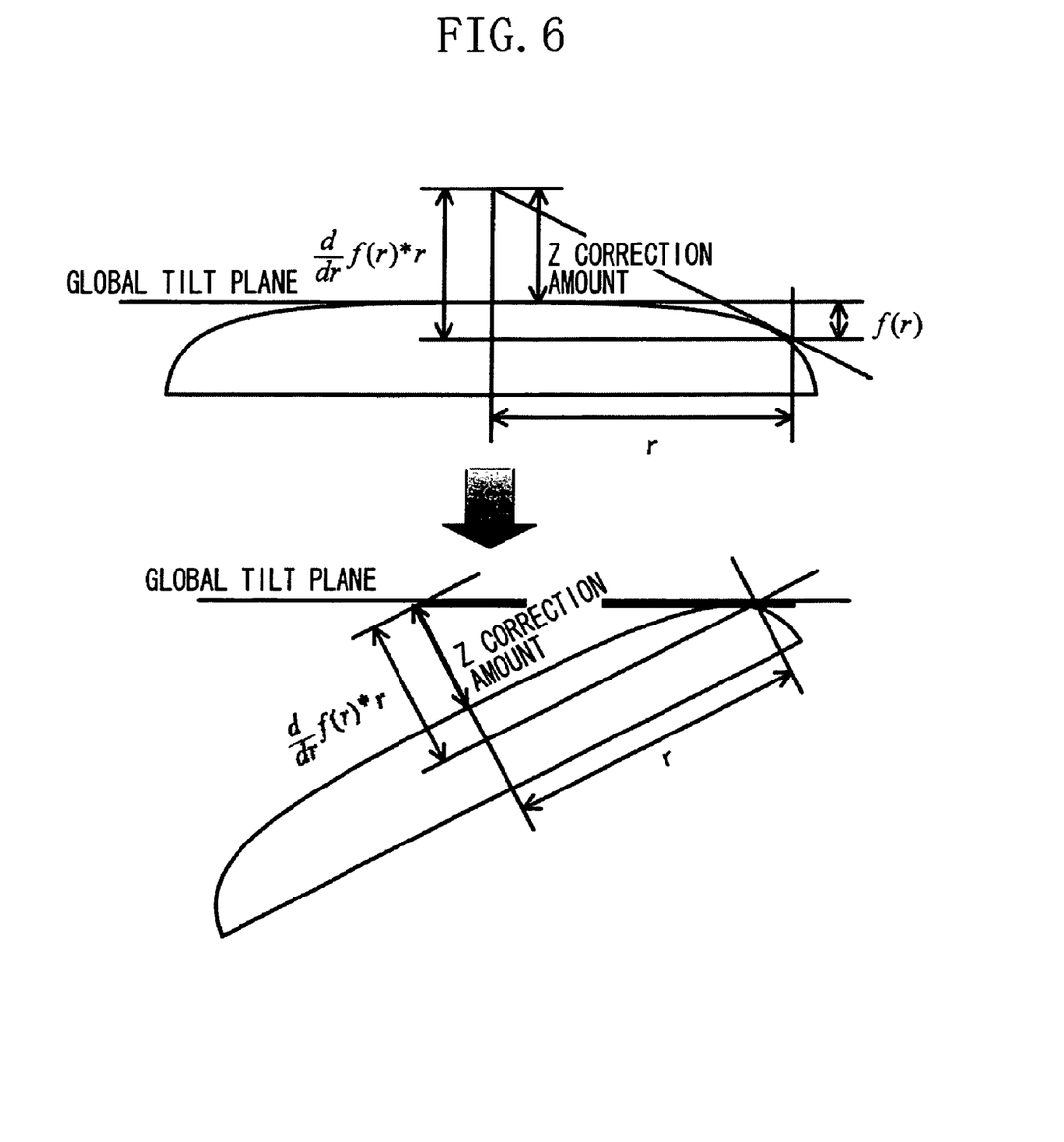
FIG. 6 illustrates a relationship of global tilt, approximation function, and Z correction amount according to the first exemplary embodiment of the present invention.

Next, referring to FIG. 6, a relation between a wafer shape and an exposure start correction amount of the scanning exposure apparatus according to the first exemplary embodiment of the present invention is described. If the wafer shape is expressed as an approximation function $fz(r)$, a function expressing a tilt with respect to the global tilt plane at a point on the wafer will be $d/dr(fz(r))$, where $d/dr$ represents taking the first derivative with respect to r. In the scanning exposure apparatus of the present exemplary embodiment, the wafer stage is rotated with the center of the chuck (r=0) at its center, thus it becomes necessary to drive the wafer stage for a distance of $d/dr(fz(r))*r$ in the Z direction. This distance is a product of the tilt of the wafer $d/dr(fz(r))$ and a distance r of the point.

A Z correction amount $d/dr(fz(r))*r - fz(r)$ and the tilt amount $d/dr(fz(r))$ obtained from the result are reflected on the global tilt target value. Before the start of the exposure (such as the exposure start of each shot), the wafer stage 702 is tilted at a specified angle. Since the wafer stage 702 is driven with this tilt angle and the Z position which changes accordingly, relative drive amount can be decreased compared to the conventional exposure apparatus.

In an exposure apparatus having a configuration of the tilting drive based on X and Y axes, the tilt amount is expressed by a product of the aforementioned $d/dr(fz(r))$ and a function of a rotation angle θ from the X axis. For example, where ωx is a tilt with X axis as a rotation axis and where ωy is a tilt with Y axis as a rotation axis, the amount of tilt ωx will be $d/dr(fz(r))*\sin θ$ and the amount of tilt ωy will be $d/dr(fz(r))*\cos θ$. Similarly, the Z correction amount is expressed as $d/dr(fz(r))*r*(\sin θ + \cos θ) - fz(r)$ considering tilting of the X and Y axes.

Next, referring to FIG. 7, a flowchart of the scanning exposure of each shot according to the present exemplary embodiment will be described. The scanning exposure is performed by shot. The focus/tilt leveling drive is performed in real time in each step having a spacing of a few millimeters in between from an exposure start step to an exposure end step of each shot. Here, the exposure start step is a step or state where a shot area enters exposure thereof to light.

While the focus/tilt leveling drive is realized in real time, the scanning exposure is driven at a constant speed. The reticle stage 701 and the wafer stage 702 of the scanning exposure apparatus are synchronized in opposite scanning directions. Since the reticle 703 and the wafer 705 are moved in opposite directions during scanning, UP scanning and DOWN scanning are performed alternately per shot.

The exposure light is not emitted when the UP scanning is switched to DOWN scanning or vice versa. The time when the exposure light is not emitted is utilized. Namely, at the timing, from when an exposure of a shot is finished to when the pre-read focus measurement of the next shot is started, the controller 712 obtains exposure start step coordinates of the next shot from the wafer shape approximation function obtained from the wafer shape measurement in step 208 and the shot layout.

In step 201, the controller 712 calculates an initial target position which is the focus/tilt amount of the exposure start step of the next shot based on the exposure start step coordinates. Before the exposure and the pre-read focus measurement of the exposure start step of the next shot are started, in step 202, the controller 712 corrects the position of the wafer stage 702 in advance based on the value which is obtained by the approximation function (generated in step 208) as described above referring to FIG. 6.

According to the prior correction drive, even in a case where the wafer stage 702 cannot follow the focus/tilt target value using only the pre-read scanning focus drive, (for example, because the tilt angle of the exposure shot is so large that the difference between the current stage position and the focus/tilt target value is great), the exposure can be started while the focus of the exposure start step matches the best focus image plane.

Figure 8:
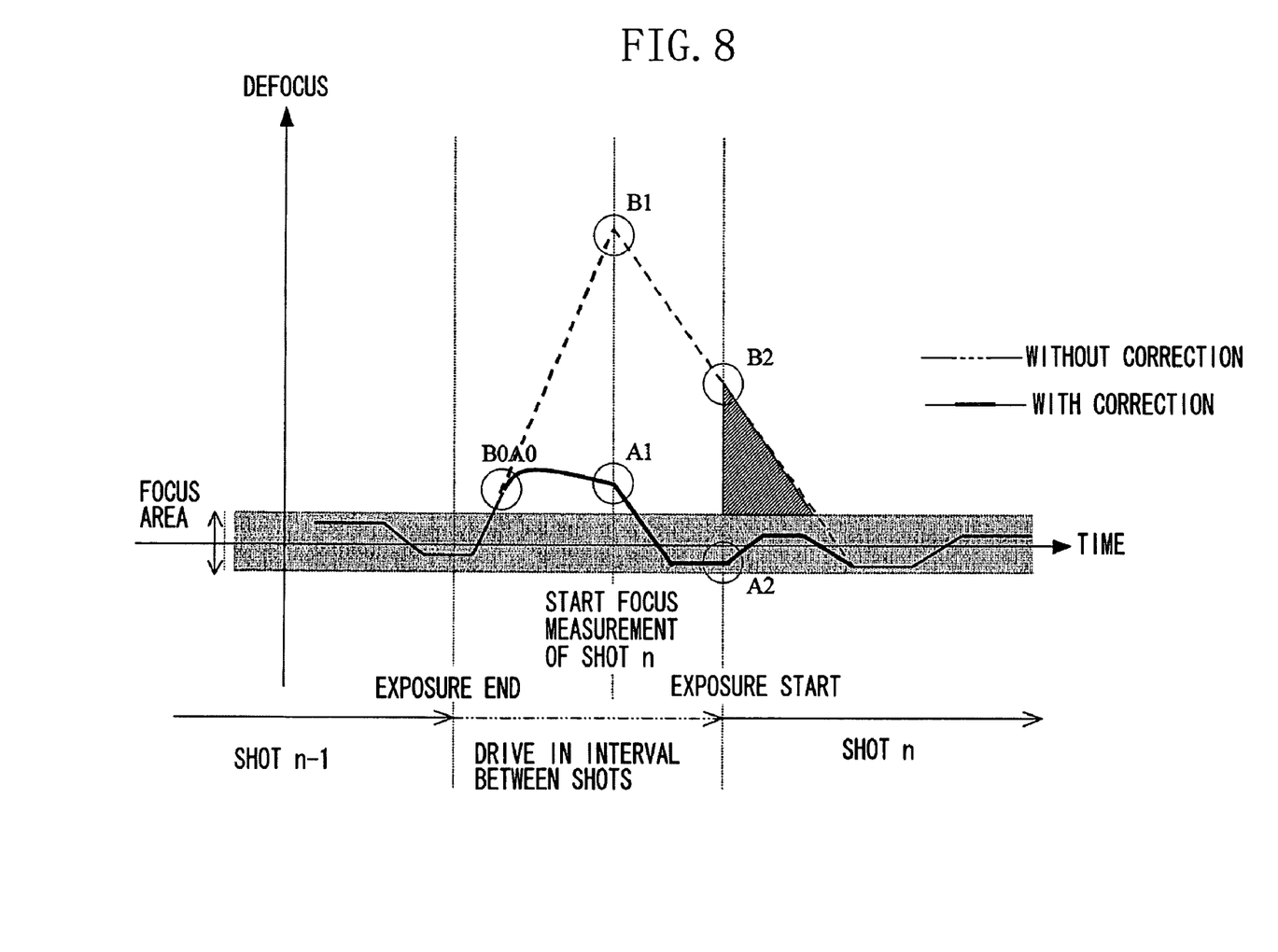
FIG. 8 illustrates an effect of correction before starting exposure of a shot according to the first exemplary embodiment of the present invention.

Referring now also to FIG. 8, an amount of defocus when a tilt of a shot n−1 and a tilt of a shot n differ greatly is illustrated. If the focus is not corrected (for example, because the present exemplary embodiment is not used), when the exposure of the shot n−1 is completed, the amount of defocus increases while the tilt amount of that time is kept at a constant level and a deviation from the best focus image plane also increases.

Then, even when the leveling drive is started at the pre-read scan measurement start position B1 during drive in interval between the shots, since the focus/tilt amount to be driven is great, the drive to the target position obtained by the pre-read measurement is not finished at position B2 under the exposure slit where the exposure of the shot n is started. Thus, the area around the exposure start area of the shot is defocused.

On the contrary, if the correction is made according to the present exemplary embodiment, after the exposure of the shot n−1 is completed, the prior correction drive B0A0 will be started based on an expected drive target value obtained by the approximation function.

Thus, when the pre-read measurement of the shot n is started at A1, the position of the wafer stage 702 is substantially corrected. As a result, a drive amount from the pre-read measurement position A1 to the exposure start position A2 becomes small. Accordingly, the wafer stage 702 can follow the best focus image plane with high accuracy at the exposure start position A2.

As a determination method for correcting the drive amount, a focus tilt amount calculated from the approximation function may be used as it is. Further, instead of reflecting the focus tilt amount calculated from the approximation function as it is, it may be assumed that there is an approximation (adjacent) exposure-finished shot having a shape which is most similar to the exposure target shot (approximation exposure target shot). In this case, a correction rate can be estimated automatically from the difference of focus/tilt measurement amount between the exposure start step of the exposure target shot and an approximation scanning measurement step of the approximation exposure-finished shot.

As a result, a highly-accurate correction which does not depend on the approximation function can be obtained. Excessive correction or insufficient correction can be prevented. For example, the correction drive amount (focus or tilt) before the start of the exposure of the shot can be calculated as follows.

Correction drive amount=approximation function (exposure start step coordinates of the exposure target shot)/approximation function (approximation step coordinates of approximation exposure finished shot)*exposure drive amount of approximation step coordinates of approximation exposure finished shot. Alternatively, correction drive amount=approximation function (exposure start step coordinates of the exposure target shot)−approximation function (approximation step coordinates of approximation exposure finished shot)+exposure drive amount of approximation step coordinates of approximation exposure finished shot.

A user can set an interface and select a calculating formula used for calculating the correction drive amount using the interface. Further, as an advanced selection, the calculating formula that expresses the least remaining drive amount after the correction in the exposure-finished shot group can be selected automatically as an optimum formula for the exposure zone. Further, the correction rate can be set manually using an interface for specifying the correction rate.

The exposure operation of the shot is started after the prior correction drive. In step 203, the controller 712 executes the scanning measurement of the shot exposure start step by the pre-reading sensor of the focus detector 706. Next, in step 204, the controller 712 calculates, using a wafer shape approximation function from step 208), an amount of the focus/tilt drive to the best focus image plane.

After the calculation of the drive amount, in step 205 before the shot exposure start step is passed through the exposure slit area to be exposed to exposure light, the controller 712 performs the focus/leveling drive of the wafer stage so that the wafer stage can follow the best focus image plane. Once processing of step 205 is performed, processing proceeds to both step 206 and step 209. In step 206, if the controller 712 determines that all the processes in steps 203, 204, and 205 are completed (YES in step 206), then the process proceeds to step 207. If all the processes in steps 203, 204, and 205 are not completed (NO in step 206), the process returns to step 203. In step 207, the controller 712 determines if all shots are completed. If not all shots are completed, (NO in step 207) processing proceeds to step 201 which starts the exposure of the next shot. However, if all shots are completed, (YES in step 207), the processing of FIG. 7 ends.

Figure 7:
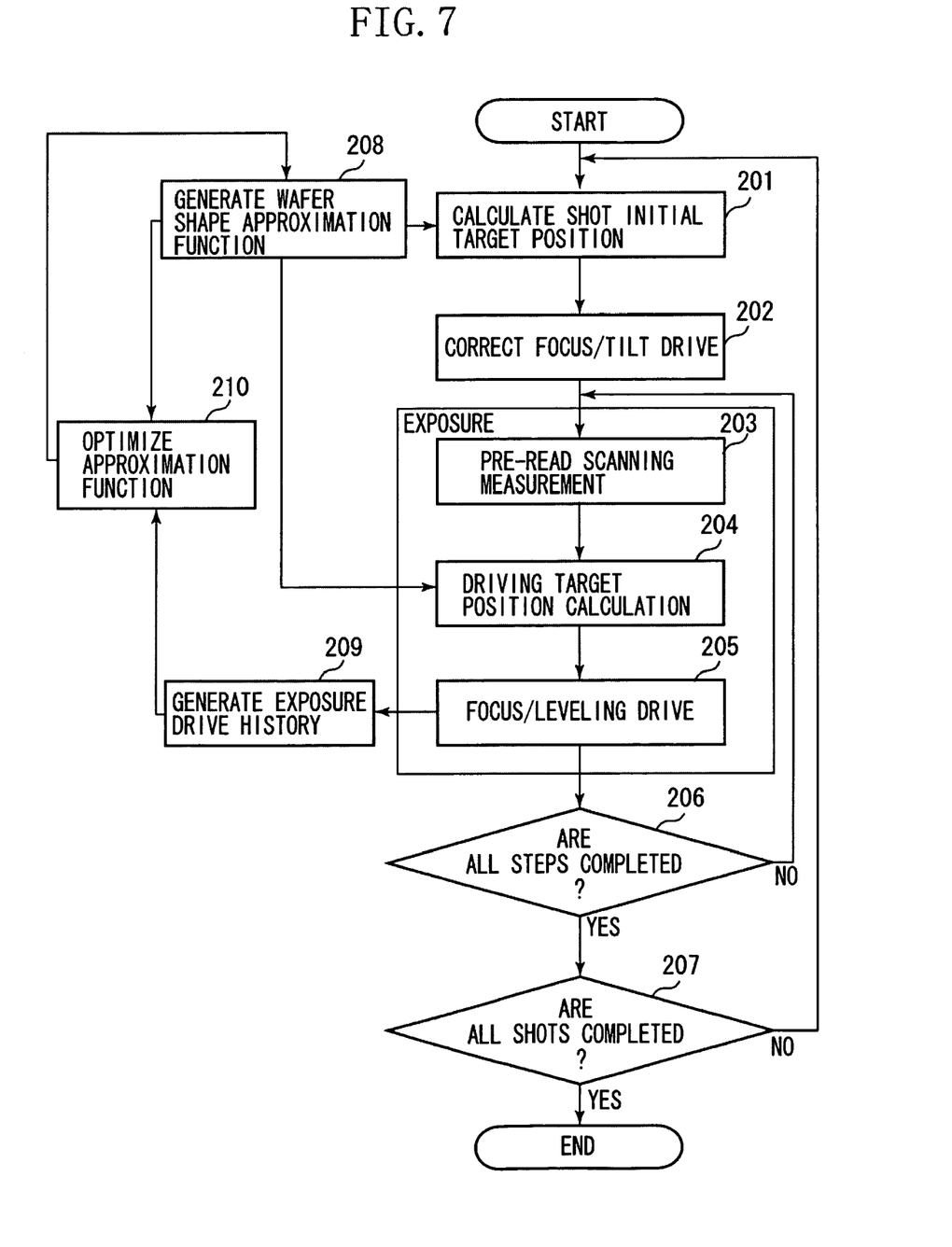
FIG. 7 is a flowchart illustrating an example of processing of scanning exposure of each shot according to the first exemplary embodiment of the present invention.

The approximation function optimization in step 210 in FIG. 7 uses both the wafer shape approximation function generated in step 208 and a wafer shape in the vicinity of the current exposure area which is obtained from exposure drive history (drive amount and remaining drive amount) generated in step 209. An expected drive locus of the un-exposed area is calculated and the result is fed back to the approximation function.

Figure 9:
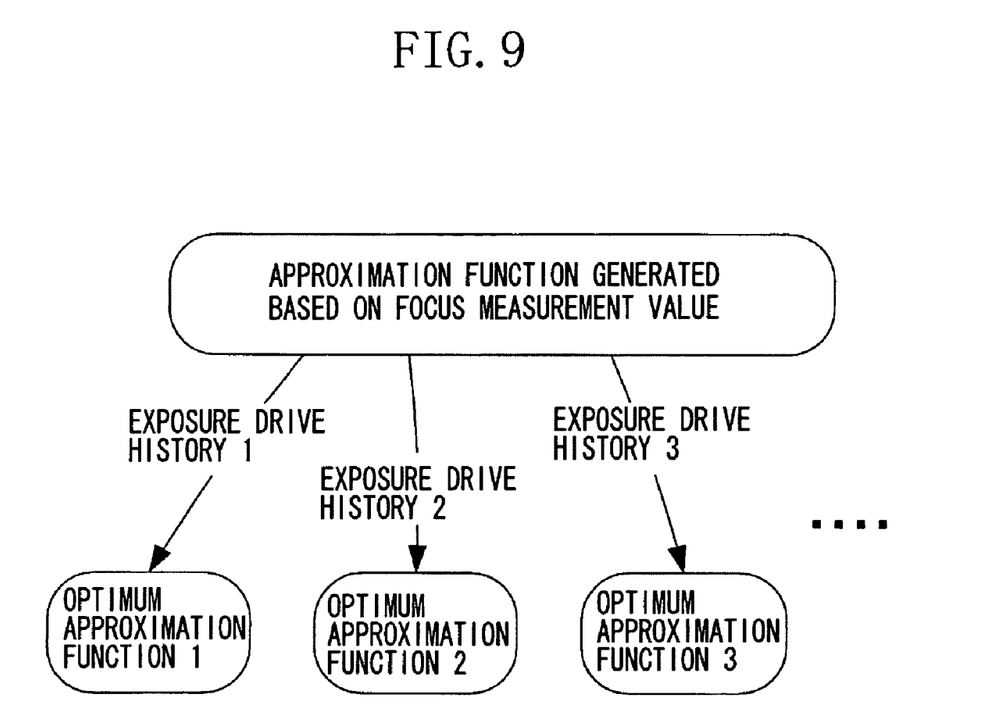
FIG. 9 illustrates a framework used for optimizing the approximation function according to the first exemplary embodiment of the present invention.

The optimization of the approximation function is performed for each exposure drive history, as illustrated in FIG. 9, based on a function which is generated according to the result of the wafer shape measurement. An optimization unit can be set using an interface for specifying timing for each step, shot, or zone. By generating a basic approximation function, if the approximation function after the optimization does not match the wafer 705 or if the remaining drive amount exceeds a tolerable amount after the correction of the driving target position, the basic approximation function can be used for correction and serve as a fail safe during the drive.

Second Exemplary Embodiment

Next, a second exemplary embodiment of the present invention will be described. An approximation function is optimized according to the second exemplary embodiment. As an application of a high-accuracy adjustment of focus/tilt at an exposure start time of a shot using the approximation function, deviation of the approximation function of an area in the vicinity of the exposure shot area is corrected by interpolation using exposure drive history of shots before the exposure shot. Thus, the approximation function optimized for each local area can be used. For the exposure after the exposure shot, a highly accurate correction can be achieved by adjusting the drive target coordinates reflecting the optimized approximation function.

According to the present exemplary embodiment, exposure target coordinates which do not depend on a measurement area from which the focus information for generating the approximation function is obtained can be acquired. Accordingly, a wafer having its peripheral areas warped in various directions, such as a saddle-shaped wafer, a wafer warped upward on the left and right sides but warped downward on the top and bottom sides or the like, can follow the best focus image plane in a whole outer peripheral area of the wafer. The focus/tilt information of each step of each shot as to which exposure and scanning focus measurement are completed is stored.

From the stored focus/tilt information, a difference between the focus/tilt information of the step which is closest to the exposure start step of the exposure shot and the focus/tilt information of the step obtained from the approximation function is acquired. The closest step of the focus/tilt information can be different in its focus, tilt X, and tilt Y. For example, the tilt X ($\omega x$) can be selected from the vertical (y) direction and the tilt Y ($\omega y$) can be selected from the perpendicular (x) direction. From the difference of the tilt information, deviation of the approximation function of the current exposure area can be estimated, and the deviation is reflected on a correction amount.

Combining both the wafer shape approximation function and the exposure drive history can contribute to improving accuracy of real time leveling drive for each step within a shot during the scanning exposure. Measurement reliability of the pre-reading sensor and the exposure slit sensor including a plurality of channels in the focus detector 706 can therefore be improved.

To be specific, by estimating the focus/tilt drive amount of a position measured by the pre-reading sensor using the wafer shape approximation function and the exposure drive history, measurement accuracy of the pre-reading sensor can be improved. More specifically, determination of validity or invalidity of the measured value of each channel included in the pre-reading sensor can be estimated from the difference between the expected drive amounts.

Regarding the exposure slit sensor, correction information can be reflected (as it is) on each channel of the exposure slit center which corresponds to each channel of the pre-reading sensor.

Generally, the focus/tilt drive amount at a pre-read position is calculated using all channels of the pre-reading sensor. However, if an abnormal value is detected due to a dust on the wafer or a wafer chuck or due to an exceptionally abrupt deformation at an extremely local area, it is desirable to calculate the focus/tilt drive target without using the measured value of that channel. Further, an incorrect drive may occur due to an abnormal measured value if measurement inhibition area (area about a few millimeters from the wafer edge and where the photoresist is removed by edge rinse processing) is not correctly set.

The leveling drive correction according to the second exemplary embodiment can be used to solve such a problem. For example, if the pre-reading sensor includes number n of channels, a total number of a combination of the channels used for calculating the drive target can be as follows. If a number of combinations in which m channels ($n \geq m$) are selected out of n channels is expressed as nCm, then the combination from a case where one channel is used to a case where all channels are used is calculated according to the following expression.

$$\text{Number of channel combinations} = nCn + nCn{-}1 + \ldots + nCm + \ldots + nC1$$

For example, if the pre-reading sensor has three channels CH1, CH2, and CH3, seven combinations of focus/tilt amount are possible. The combinations are CH1+CH2+CH3, CH1+CH2, CH2+CH3, CH1+CH3, CH1, CH2, and CH3. Actually, since the measurable tilt information depends on hardware configuration of each channel, actual number of combinations may be less than the number of combinations calculated using the above expression.

By obtaining a difference between each of all pre-read focus/tilt drive targets obtained from a combination of each channel and an expected focus/tilt drive target obtained from the approximation function and the exposure drive history, it is determined whether there is any abnormality in the measured value of each channel. Further, since it is typically desirable to have more number of channels in obtaining the drive target, a channel in which an abnormal-value is measured can be detected after weighting the difference depending on a combination of the channels, in order to minimize a difference (deviation) of a combination including larger number of channels.

As described above, using the expected drive amount obtained from the approximation function during the focus/leveling drive, the abnormal-value-measured channel can be detected. Further, if the number of the drive target determination channels is not enough after removal of the abnormal-value-measured channel, for example, if only one channel is left and thus calculation of the tilt cannot be performed, then a drive amount of a previous step can be used to interpolate the calculation of the tilt and drive accuracy can be maintained.

Figure 10:
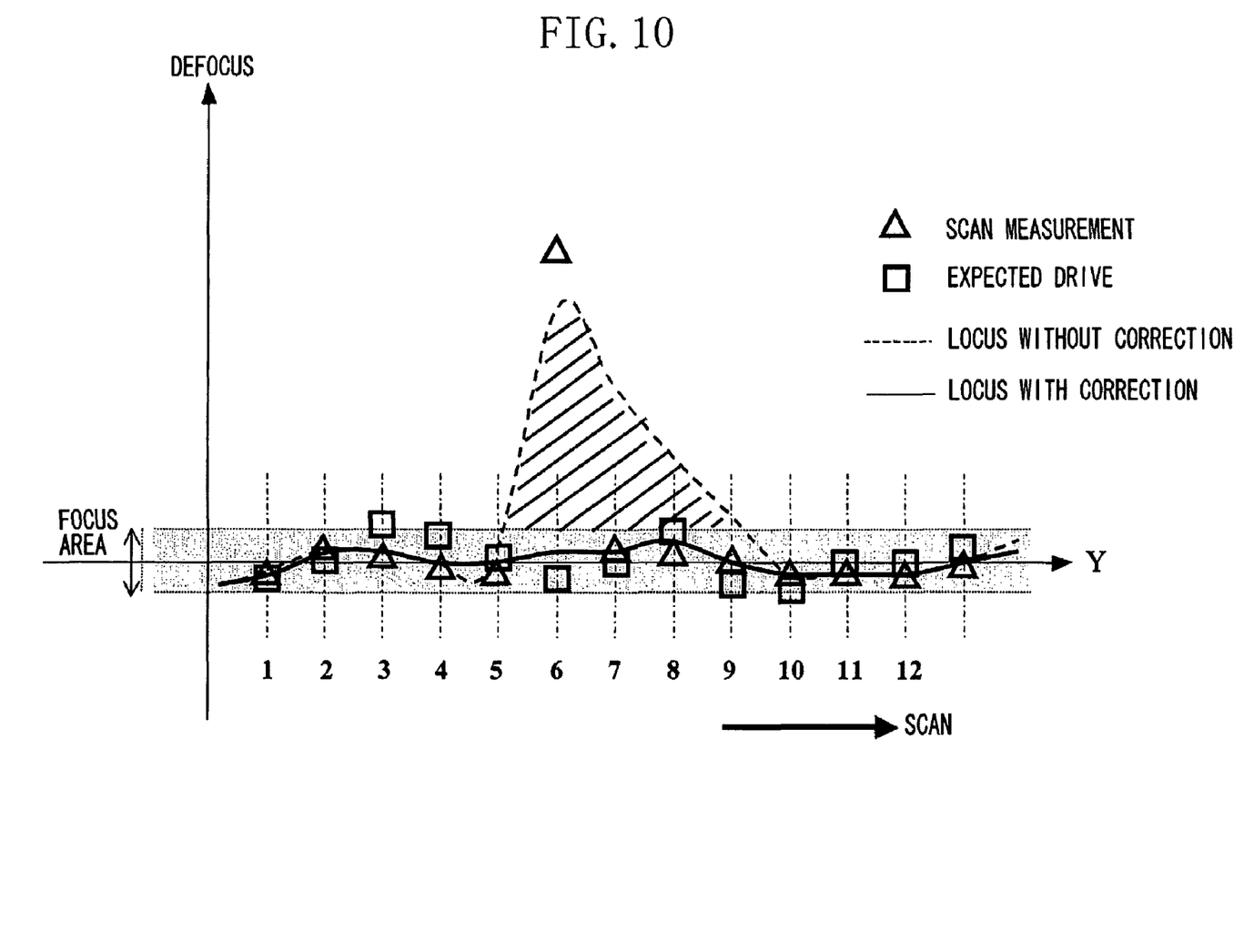
FIG. 10 illustrates an effect of correction during an exposure of a shot according to a second exemplary embodiment of the present invention.

FIG. 10 is a graph showing amounts of defocus with respect to a drive locus obtained from the scanning measurement values without the correction and a drive locus obtained from the scanning measurement values by performing the correction with the approximation function. The present exemplary embodiment is on the assumption that the measurement in the sixth step is skipped due to dust. The drive locus performing no correction, (for example, to which the present exemplary embodiment is not applied), defocuses greatly in the sixth step. The seventh and later steps are also affected by the sixth step, and the scanning is performed while it is defocused for a while.

On the contrary, according to the drive locus performing the correction of the present exemplary embodiment, the abnormal-value-measured channel is detected from the approximation function and the drive history. Furthermore, owing to the interpolation using the expected drive amount, smooth scanning which is independent of a local irregular shape along the wafer shape becomes possible. Furthermore, the wafer shape measurement and the approximation function obtained from the wafer shape measurement are effective in a case where an amount of change of the wafer shape (mainly the tilt component) obtained from the approximation function is extremely large.

In this case, regardless of whether the correction drive of the present exemplary embodiment is applied, there may be a shot in which a wafer stage cannot follow a best focus image plane with accuracy at a scanning speed which is set by a user. In such a case, an optimum scanning speed can be calculated considering the wafer stage following capability and the synchronization accuracy of the wafer stage with the reticle stage. The amount of change of the wafer shape, for example, may be inversely proportional to the scanning speed.

The optimization of the scanning speed can be performed not only for each wafer but also for each shot using coordinate position information of each shot obtained from a layout of the shots. Similarly, if an approximation function is generated for each zone, optimization of scanning speed for each zone becomes possible.

Further, from the result of the wafer shape measurement, a deformation which exceeds a focus margin (depth) may be observed. For example, if the deformation with very sharp projections and depressions in a local area with a size of an exposure slit is observed, photosensitive material of a shot with a defective resolution may come off during the post process. When the deformation is observed, the exposure of the shot in such an area can be skipped or exposure of all shots on the wafer can be skipped.

Further, it is frequently desirable to implement an interface which can notify information about a shot on which exposure is skipped and can determine whether to execute the auto skip function. Alternatively, if a large number of wafers are to be exposed, manufacturing of defective products can be prevented by stopping the sequence.

In the wafer shape focus measurement used for generating the approximation function, an abnormal value may be included in the measured values. This is a case where, for example, extremely fine dust adhering to a measurement substrate (wafer) is detected by the focus measurement sensor or an extremely large value is measured according to disturbance. An example of avoiding such a problem even when an abnormal value is included in the measured data will be described referring to FIG. 11.

Figure 11:
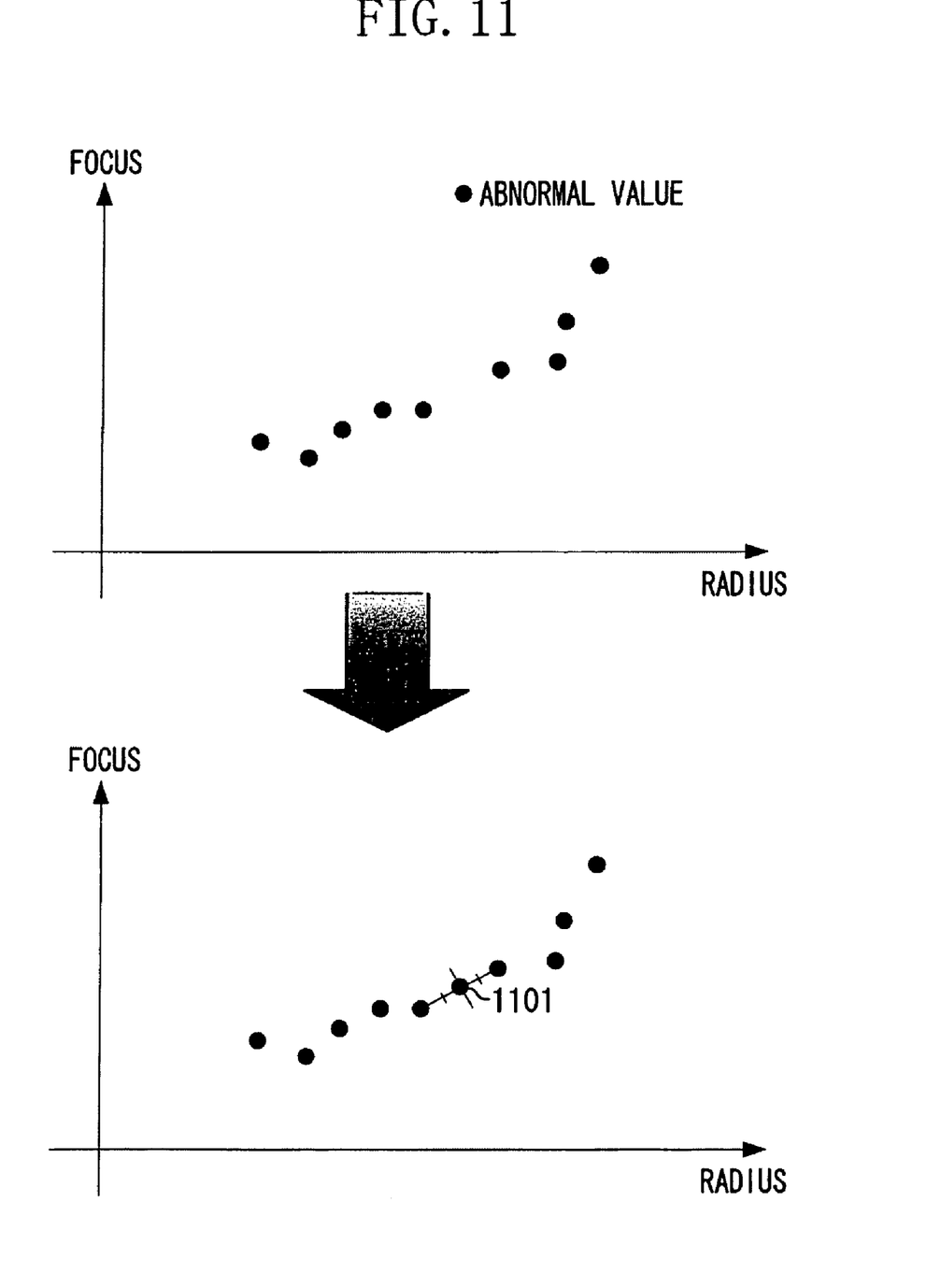
FIG. 11 describes a method for circumventing an abnormal value which is detected by a measurement of the wafer shape according to the second exemplary embodiment of the present invention.

Focus value data of each measurement point is checked whether it is extremely different from data taken from neighboring measurement points or points with similar radius coordinates. If the focus value exceeds a specified threshold value, then the focus value is regarded as an abnormal value and not used for generating the approximation function. If a number of samples is not enough, a mean value is calculated using the focus measurement values taken from the neighboring points and used to interpolate data of the point with abnormal value. In FIG. 11, a point with abnormal value is interpolated by an average value of two neighboring points yielding an interpolation value 1101 as shown at the bottom of FIG. 11.

If many abnormal values are detected, the values can be interpolated using function approximation of normal data taken from a plurality of points in the vicinity or filter processing may be performed to a part or whole of the measured data. In this way, accurate approximation function can be obtained even if an abnormal value is included.

The exposure apparatus can be equipped with an interface used for specifying a correction target area. Specifying the correction target area corresponds to specifying an area for correcting the drive of the wafer stage. If the correction target area is not specified and, for example, the approximation function illustrated in FIG. 5 is used, a curvature start point Ro, which is a configuration parameter and also corresponds to a circular line with radius coordinates of Ro mm, will be a border of the correction target area and non-correction target area. If the exposure target shot is located on the inner side of the curvature start point Ro, since the amount of correction is zero, correction will not be made.

Generally, whether to apply or not to apply the correction and switching between the correction and no correction can be sufficiently determined by the parameter. However, depending on the wafer shape, there is a case where it is desirable to set the correction target area outside of the curvature start point Ro. Such a wafer has a projection or a depression in a certain area of the wafer. For example, such a wafer may have a great upward warp in the outer peripheral area and a projection near the center of the wafer and thus the focus shape of the wafer does not increase monotonically.

Generally in an outer peripheral area of the wafer, defocus which leads to defective exposure shot is caused by a shot in the outermost peripheral area that shows a greatest tilt amount. Thus, if the correction targets are such shot areas, a number of measurement samples for generating the approximation function can be reduced. This contributes to improving throughput. In such a use case, shot layout information is known and it is advantageous that the exposure correction target area can be specified by an interface.

The exposure apparatus can be equipped with an interface for specifying timing for performing the wafer shape focus measurement used for generating the approximation function. Since a user has information about types of processed wafer groups which are to be processed, for example, difference exposure conditions and difference of pre-process/post-process processing, the user can generate a job by forming a set of a plurality of wafers with the same type, and perform the exposure process. If the set of wafers is defined as a lot, in consideration of throughput and fitting accuracy of the approximation function to the wafers, focus measurement is performed as to a first wafer of the lot as a timing of generating the approximation function according to the present exemplary embodiment. The approximation function obtained from this measurement is applied to other wafers in the same lot.

However, it is also effective to re-obtain approximation function within a lot at an arbitrary timing. For example, if variation of the wafer shape is assumed to exceed a specified amount within a lot, since the wafer shapes of neighboring shots are similar, the focus measurement and the generation of the approximation function will be performed at intervals of several wafers.

With respect to the wafer which is not measured, as mentioned above, an approximation function which is obtained from the closest shot is applied and the approximation function is generated for each wafer at the highest frequency. If the wafer shapes are not different between lots, it is necessary to be able to specify and generate, for example, one approximation function in a plurality of lots from the standpoint of total throughput.

Further, a new function can be regenerated by combining approximation functions obtained from measurement results of a plurality of wafers. Thus, shape data of a plurality of wafers is managed and the approximation function can be regenerated by combining the data. For example, by generating approximation functions using data taken from a first wafer through a specified wafer in a lot, a function including the approximation functions of the wafers using moving average can be applied to the subsequent wafers.

Assuming such a use case, it is important to have an interface which performs the defocus measurement and generates the approximation function at an arbitrary timing.

As an advanced method for obtaining a timing for generating the approximation function, a rough shape of the wafer is managed by a table. The shape of the wafer is obtained from the measurement result of the global tilt correction (step 102) which is performed for each wafer before the exposure. Then, if it is determined that a shape of the exposure target wafer is significantly different from the global shape of the previous wafer obtained from the management information, then a regeneration sequence of the approximation function can be automatically executed. Furthermore, if a focus control result (stage tracking remains) exceeds a specified tolerable amount, the approximation function can be regenerated by managing the focus control result during the exposure instead of using the global tilt information.

The apparatus can be equipped with an interface that notifies the apparatus whether to perform the regeneration of the approximation function which is determined automatically. As a further effective function for wafer shape measurement, a ring-shaped area where photoresist is removed and located a few millimeters from the edge of the wafer can be detected from the measurement values especially in the vicinity of the peripheral area. Then the measurement inhibition area which is set as a parameter can be internally adjusted. Accurate setting of the measurement inhibition area facilitates calculation of the target drive locus at the focus/leveling drive.

Exemplary Embodiment of Device Manufacturing Method

Next, an exemplary embodiment of a device manufacturing method using the above-described exposure apparatus is next described. A device (for example, a semiconductor integrated circuit element or a liquid crystal display element) can be manufactured through a step of exposing a photosensitive material-applied substrate (for example, a wafer, a glass plate, or the like) to light using any of the exposure apparatuses of the exemplary embodiments, a step of developing the exposed substrate, and other known process steps.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-131079 filed May 16, 2007, which is hereby incorporated by reference herein in its entirety.

What is claimed is:

1. An exposure apparatus configured to expose a substrate to light, the apparatus comprising:
    a stage configured to hold the substrate and to be moved;
    a projection optical system configured to project light from an original plate onto the substrate held by the stage;
    a measurement device configured to measure a position of a surface of the substrate in a direction of an optical axis of the projection optical system; and
    a controller configured to concurrently control a scan of the stage in a scanning direction perpendicular to the direction of the optical axis, a measurement of the position of the surface in a shot area on the substrate by the measurement device, a movement of the stage according to the measured position of the surface, and an exposure of the shot area,
    wherein the controller is further configured to
    i) cause the measurement device to measure positions of the surface with respect to a plurality of points on the surface over a plurality of shot areas on the substrate,
    ii) obtain a shape of the surface based on the positions of the surface measured with respect to the plurality of points, and
    iii) cause the stage to be moved based on the obtained shape between an exposure of a first shot area on the substrate and an exposure of a second shot area on the substrate, and the measurement device to measure a position of a surface in the second shot area.

2. An apparatus according to claim 1, wherein the controller is configured to control the position of the stage where the measurement device starts a measurement with respect to the second shot area for the exposure of the second shot area based on the obtained shape.

3. An apparatus according to claim 1, wherein the controller is configured to obtain the shape of the surface by an approximation using a function of a distance from a center of the substrate.

4. An apparatus according to claim 1, wherein the controller is configured to obtain the shape of the surface with respect to a partial area of the surface.

5. An apparatus according to claim 1, wherein the controller is configured to obtain the shape of the surface with respect to each of divided areas of the surface.

6. An apparatus according to claim 1, wherein the controller is configured such that the plurality of points are set by specifying the plurality of shot areas on the substrate.

7. An apparatus according to claim 1, wherein the controller is configured to correct the obtained shape based on the position of the surface measured by the measurement device with respect to the second shot area.

8. An apparatus according to claim 1, wherein the controller is configured to update the obtained shape based on the position of the surface measured by the measurement device with respect to the second shot area.

9. An apparatus according to claim 1, wherein the controller is configured to obtain the shape of the surface with respect to a specified substrate in a lot of the substrate.

10. An apparatus according to claim 1, wherein the controller is configured such that the shape of the surface is updated by averaging shapes of surfaces obtained with respect to a plurality of substrates in a lot of the substrate.

11. An apparatus according to claim 1, wherein the controller is configured to set a speed of the scan based on the obtained shape.

12. A method of manufacturing a device, the method comprising:
    exposing a substrate to light using an exposure apparatus defined in claim 1;
    developing the exposed substrate; and
    processing the developed substrate to manufacture the device.

* * * * *